US008634052B2

(12) United States Patent
Auer-Jongepier et al.

(10) Patent No.: US 8,634,052 B2
(45) Date of Patent: Jan. 21, 2014

(54) LITHOGRAPHIC APPARATUS AND METHOD INVOLVING A RING TO COVER A GAP BETWEEN A SUBSTRATE AND A SUBSTRATE TABLE

(75) Inventors: Suzan Leonie Auer-Jongepier, Valkenswaard (NL); Jeroen Johannes Sophia Maria Mertens, Duizel (NL); Frank Bernhard Sperling, Nuenen (NL); Teunis Cornelis Van Den Dool, Delft (NL); Eva Mondt, Eindhoven (NL); Alexander Nikolov Zdravkov, Eindhoven (NL); Paulus Martinus Hubertus Vissers, Nederweert (NL)

(73) Assignee: ASML Netherlands B.V., Veldhoven (NL)

(*) Notice: Subject to any disclaimer, the term of this patent is extended or adjusted under 35 U.S.C. 154(b) by 407 days.

(21) Appl. No.: 11/987,131

(22) Filed: Nov. 27, 2007

(65) Prior Publication Data

US 2008/0186460 A1   Aug. 7, 2008

Related U.S. Application Data

(60) Provisional application No. 60/874,488, filed on Dec. 13, 2006.

(51) Int. Cl.
*G03B 27/52* (2006.01)

(52) U.S. Cl.
USPC ............................................. 355/30; 355/72

(58) Field of Classification Search
USPC ......................................... 355/30, 72–74, 53
See application file for complete search history.

(56) References Cited

U.S. PATENT DOCUMENTS

| 4,509,852 | A | 4/1985 | Tabarelli et al. | 355/30 |
|---|---|---|---|---|
| 7,199,858 | B2 | 4/2007 | Lof et al. | 355/30 |
| 2004/0136494 | A1 | 7/2004 | Lof et al. | 378/34 |
| 2004/0160582 | A1* | 8/2004 | Lof et al. | 355/30 |
| 2004/0207824 | A1 | 10/2004 | Lof et al. | 355/30 |
| 2007/0008508 | A1 | 1/2007 | Lin et al. | 355/30 |
| 2007/0115450 | A1 | 5/2007 | Nagasaka et al. | |

FOREIGN PATENT DOCUMENTS

| EP | 1 420 300 A2 | 5/2004 |
|---|---|---|
| EP | 1429188 A2 | 6/2004 |
| EP | 1 420 300 A3 | 8/2005 |
| JP | 2004-289127 A | 10/2004 |
| JP | 2005-191557 A | 7/2005 |
| JP | 2005-203681 A | 7/2005 |
| JP | 2005-236189 | 9/2005 |
| JP | 2006-005707 | 1/2006 |

(Continued)

OTHER PUBLICATIONS

Translation of JP 2006-120889, Ishimaru, May 2006.*

(Continued)

*Primary Examiner* — Chia-how Michael Liu
(74) *Attorney, Agent, or Firm* — Pillsbury Winthrop Shaw Pittman LLP

(57) ABSTRACT

A lithographic apparatus that includes a substrate table holding a substrate, a projection system configured to project a patterned beam of radiation onto the substrate, a liquid supply system configured to provide a liquid to a space between the projection system and the substrate table, and a ring located such that it covers a gap between the substrate and the substrate table, the ring being in contact with the substrate and with the substrate table.

34 Claims, 9 Drawing Sheets

(56) References Cited

FOREIGN PATENT DOCUMENTS

| | | |
|---|---|---|
| JP | 2006-059454 | 3/2006 |
| JP | 2006-120889 A | 5/2006 |
| JP | 2006-148092 | 6/2006 |
| JP | 2006-200562 | 8/2006 |
| JP | 2006-202825 A | 8/2006 |
| JP | 2006-237255 A | 9/2006 |
| JP | 2007-142168 A | 6/2007 |
| JP | 2008-153651 | 7/2008 |
| WO | WO 99/49504 | 9/1999 |
| WO | 2005/059977 | 6/2005 |

OTHER PUBLICATIONS

Translation of Hieda (JP 2006-202825). Aug. 2006.*

Lin, Burn J., "Lithography for 32nm Half Pitch," TSMC, Inc. Jul. 2006, pp. 1-39.

Office Action in related Japanese Application 2007-315492 mailed Nov. 15, 2010. I.

Japanese Office Action mailed May 13, 2013 in corresponding Japanese Patent Application No. 2011-114517. X.

* cited by examiner

LITHOGRAPHIC APPARATUS AND METHOD INVOLVING A RING TO COVER A GAP BETWEEN A SUBSTRATE AND A SUBSTRATE TABLE

This non-provisional application claims the benefit of and priority to U.S. Provisional Application No. 60/874,488, filed Dec. 13, 2006, the entire contents of which application is hereby incorporated by reference.

FIELD

The present invention relates to a lithographic apparatus and method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperature (NA) of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

Turbulence may cause bubbles to be generated in immersion liquid. Where this occurs the bubbles may obscure or distort parts of a pattern being projected onto the substrate.

It is advantageous, for example, to provide a lithographic apparatus and method which may reduce the occurrence of bubbles in the liquid.

According to an aspect of the invention there is provided a lithographic apparatus, comprising a substrate table configured to hold a substrate, a projection system configured to project a patterned beam of radiation onto the substrate, a liquid supply system configured to provide a liquid to a space between the projection system and the substrate table, and a ring configured and sized to substantially cover a gap between the substrate and the substrate table, the ring, when covering the gap, being in contact with the substrate and with the substrate table and the ring comprising, on a lowermost surface, a protrusion dimensioned to fit into the gap.

According to an aspect of the invention there is provided a lithographic apparatus, comprising a substrate table configured to hold a substrate, a projection system configured to project a patterned beam of radiation onto the substrate, a liquid supply system configured to provide a liquid to a space between the projection system and the substrate table, and a ring configured and sized to substantially cover a gap between the substrate and the substrate table, the ring, when covering the gap, being in contact with the substrate and with the substrate table and the ring comprising a plurality of recesses which extend partway to an outer edge of the ring, or an inner edge of the ring, or both the inner and outer edges.

According to an aspect of the invention there is provided a lithographic apparatus, comprising a substrate table configured to hold a substrate, a projection system configured to project a patterned beam of radiation onto the substrate, a liquid supply system configured to provide a liquid to a space between the projection system and the substrate table, and a ring configured and sized to substantially cover a gap between the substrate and the substrate table, the ring, when covering the gap, being in contact with the substrate and with the substrate table and the ring comprising a hydrophobic surface on a sealing portion of the ring.

According to an aspect of the invention there is provided a ring with an inner diameter which is less than the outer diameter of a conventional lithographic substrate and an outer diameter which is greater than the outer diameter of a conventional lithographic substrate, wherein the ring comprises a flange having an inner diameter which is greater than the outer diameter of a conventional lithographic substrate.

According to an aspect of the invention there is provided a lithographic apparatus, comprising a substrate table configured to hold a substrate, a projection system configured to project a patterned beam of radiation onto the substrate, a liquid supply system configured to provide a liquid to a space between the projection system and the substrate table, and a substrate handler configured to move a substrate from or to the substrate table, the substrate handler comprising a ring handler configured to (i) place a ring on a substrate, (ii) remove a ring from the substrate, or (iii) both (i) and (ii), the ring being arranged to substantially cover a gap between the substrate and the substrate table when the substrate is held by the substrate table and the ring comprising, on a lowermost surface, a protrusion dimensioned to fit into the gap.

According to an aspect of the invention there is provided a lithographic method comprising providing a substrate and a ring on a substrate table, the ring comprising, on a lowermost surface, a protrusion dimensioned to fit into a gap between the substrate and the substrate table, securing the substrate and the ring to the substrate table such that the ring presses against the substrate and against the substrate table, providing a liquid to a space between a projection system and the substrate table, projecting a pattern onto the substrate via the projection system, and removing the substrate and the ring from the substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
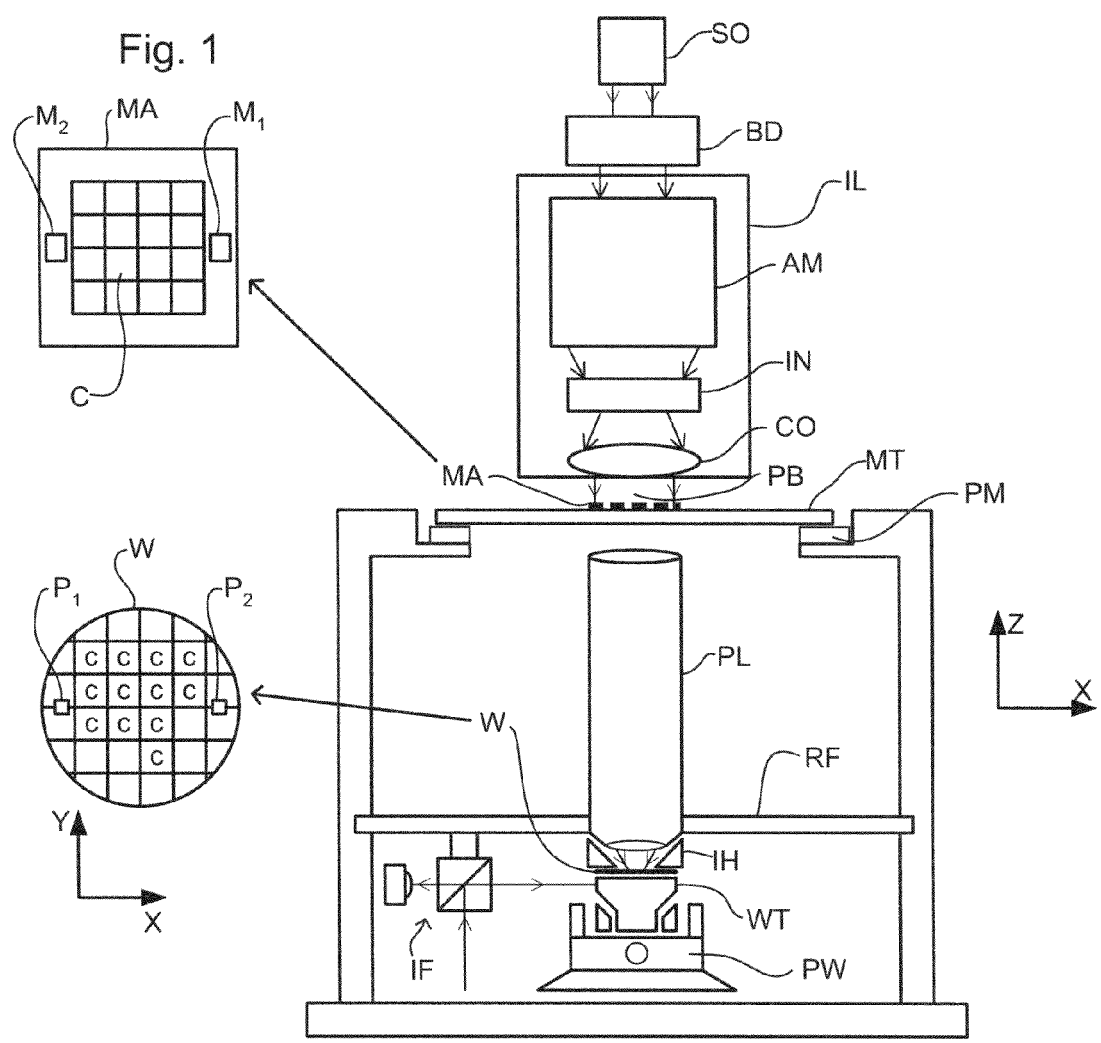
FIG. 1 depicts a lithographic apparatus to which an embodiment of the invention may be applied.
Figure 2:
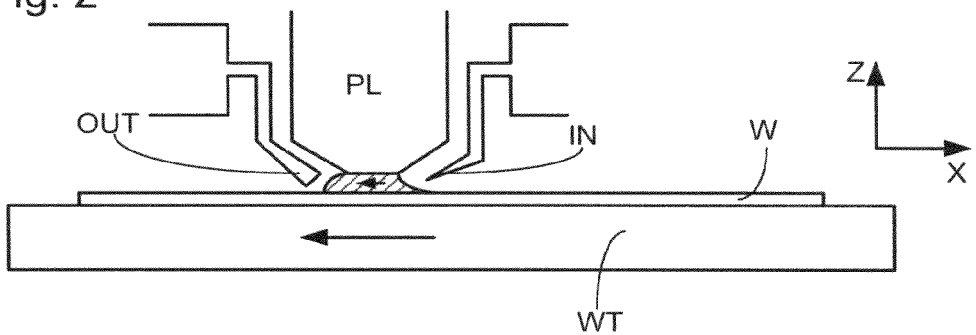
FIGS. 2 and 3 depict a liquid supply system for use in a lithographic apparatus.
Figure 3:
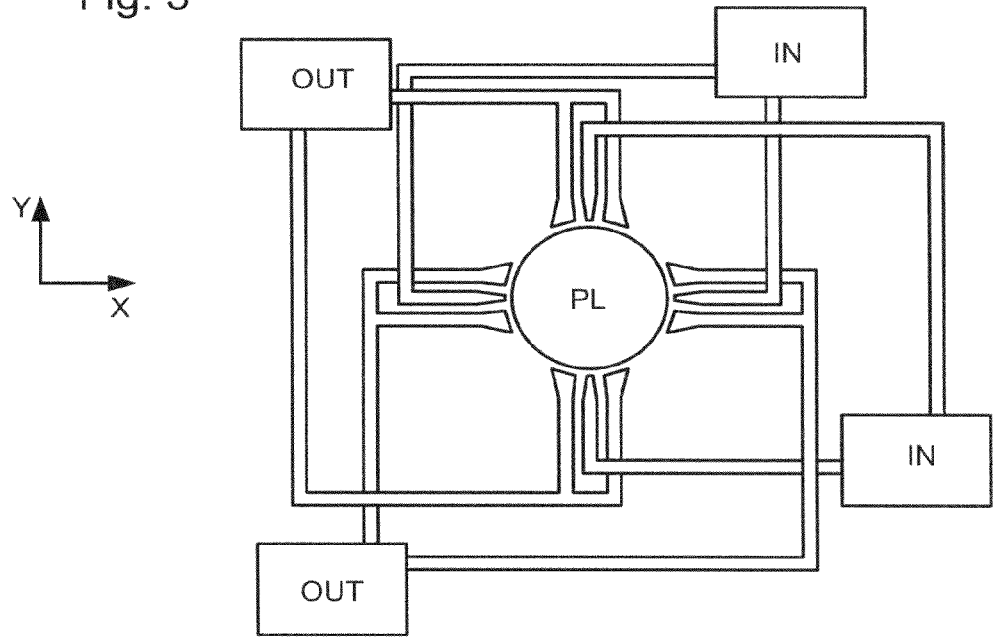

FIG. 1 schematically depicts a lithographic apparatus to which the invention may be applied of the invention. The apparatus comprises:

an illumination system (illuminator) IL configured to condition a radiation beam PB (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables or support structure may be used in parallel, or preparatory steps may be carried out on one or more tables or support structures while one or more other tables or support structure are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask) MA, which is held on the support structure (e.g., mask table) MT, and is patterned by the patterning device. Having traversed the patterning device MA, the radiation beam PB passes through the projection system PL, which focuses the beam onto a target portion C of the substrate W. An immersion hood IH, which is described further below, supplies immersion liquid to a space between the final element of the projection system PL and the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table. An embodiment of the invention may be applied to such a dual stage immersion lithography apparatus.

Figure 4:
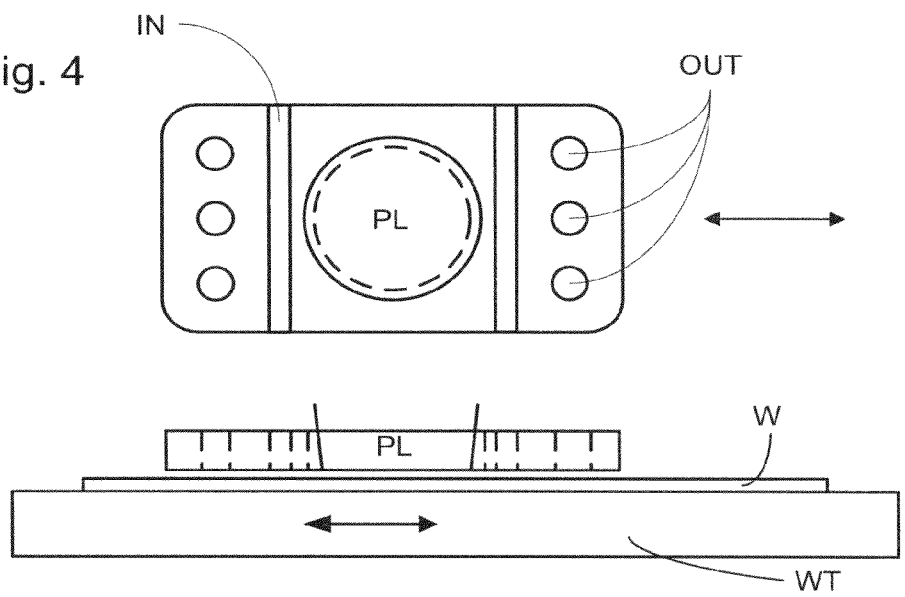
FIG. 4 depicts another liquid supply system for use in a lithographic apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
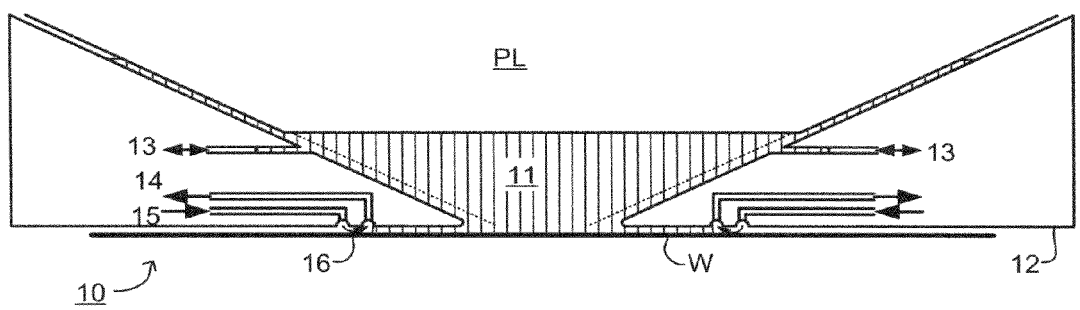
FIG. 5 depicts another liquid supply system for use in a lithographic apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate and may be a contactless seal such as a gas seal.

The liquid confinement structure 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13 and may be removed by liquid outlet 13. The liquid confinement structure 12 may extend a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

Figure 6:
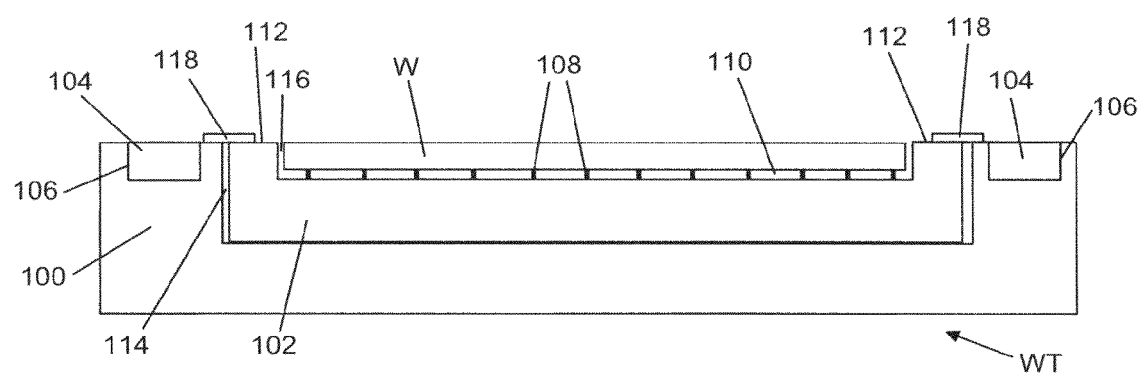
FIG. 6 depicts a substrate table of the lithographic apparatus to which an embodiment of the invention may be applied.

FIG. 6 shows schematically in cross section a substrate table WT. The substrate table WT comprises an outer portion 100 and a substrate receiving portion 102. A substrate W is present on the substrate receiving portion 102. One or more optical detectors and associated electronics 104 are provided in recess(es) 106 provided in the outer portion 100 of the substrate table WT. The substrate receiving portion 102 of the substrate table is provided with an array of protrusions 108 which protrude upwards from the substrate receiving portion. The substrate W rests upon the protrusions 108. The protrusions 108 are dimensioned such that most, if not all, contamination particles rest between the protrusions and do not come into contact with the substrate W.

The substrate W is located in a recess 110 provided in the substrate receiving portion 102 of the substrate table WT. The recess 110 is dimensioned such that when a substrate is present an upper surface of the substrate W is substantially parallel with an upper surface of side(s) 112 of the substrate receiving portion 102.

In use, a substrate W is delivered to the substrate table WT by a substrate handler (not shown). A pattern is projected onto the substrate via the projection system PL (see FIGS. 1-4) of the lithographic apparatus. Once projection of the pattern has been completed, the substrate W is removed from the substrate table WT by the substrate handler, and is replaced by another substrate. The substrate receiving portion 102 generally remains in place in the outer portion 100 of the substrate table (i.e. it is not removed from the outer portion 100 during exposure operation of the lithographic apparatus).

A gap 114 is present between the substrate receiving portion 102 and the outer portion 100 of the substrate table. An additional gap 116 is present between an outer edge of the substrate W and the substrate receiving portion 102 of the substrate table WT. The gap between the substrate receiving portion 102 and the outer portion 100 of the substrate table may be closed for example by fixing adhesive plastic tape 118 over the gap. However, the same approach may not be used to close the gap between the edge of the substrate W and the substrate receiving portion 102 of the substrate table WT, since it is necessary to be able to load and unload substrates from the substrate receiving portion during operation of the lithographic apparatus.

Figure 7:
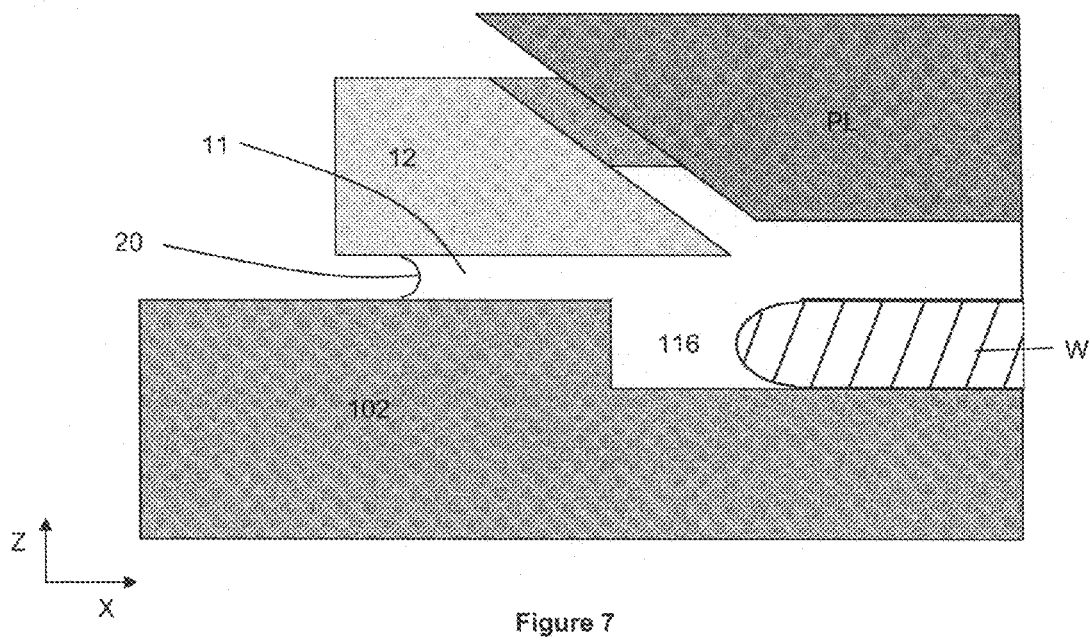
FIG. 7 depicts closer view of part of the substrate table of the lithographic apparatus.

FIG. 7 shows schematically in more detail the gap 116 between the substrate W and the substrate receiving portion 102 of the substrate table. FIG. 7 also shows part of the projection system PL of the lithographic apparatus and the liquid confinement structure 12 described above in relation to FIG. 5. Liquid 11 is present between the projection system PL and the substrate W. Liquid is also present between the liquid confinement structure 12 and the substrate receiving portion 102 of the substrate table. The liquid 11 forms a meniscus 20 at its outer edge. Liquid 11 is also present in the gap 116 between the substrate W and the substrate receiving portion 102.

In use, the substrate table WT moves rapidly beneath the projection system PL and the liquid confinement structure 12, in order to allow a pattern to be projected onto different locations on the substrate W. When the gap 116 passes under the projection system PL and liquid confinement structure 12 this may cause turbulence to be generated in the liquid, which may in turn cause bubbles to be formed in the liquid. This is undesirable since the bubbles may prevent accurate projection of the pattern onto the substrate.

In addition or alternatively, the liquid 11 on flowing into the gap 116 may flow between the protrusions 108 in the recess 110 of the substrate receiving portion 102 of the substrate table WT. This may cause contamination of the liquid, and may interfere with the generation of the vacuum which is used to secure the substrate W.

A solution to this problem could be to extract the liquid 11 from the gap 116, for example using a liquid extraction apparatus. Unfortunately, this approach may introduce a significant thermal load on the substrate table and/or the substrate, caused by evaporation of the liquid in the extraction channel. Furthermore, the extraction of the liquid may not suppress the generation of bubbles in the liquid.

Figure 8:
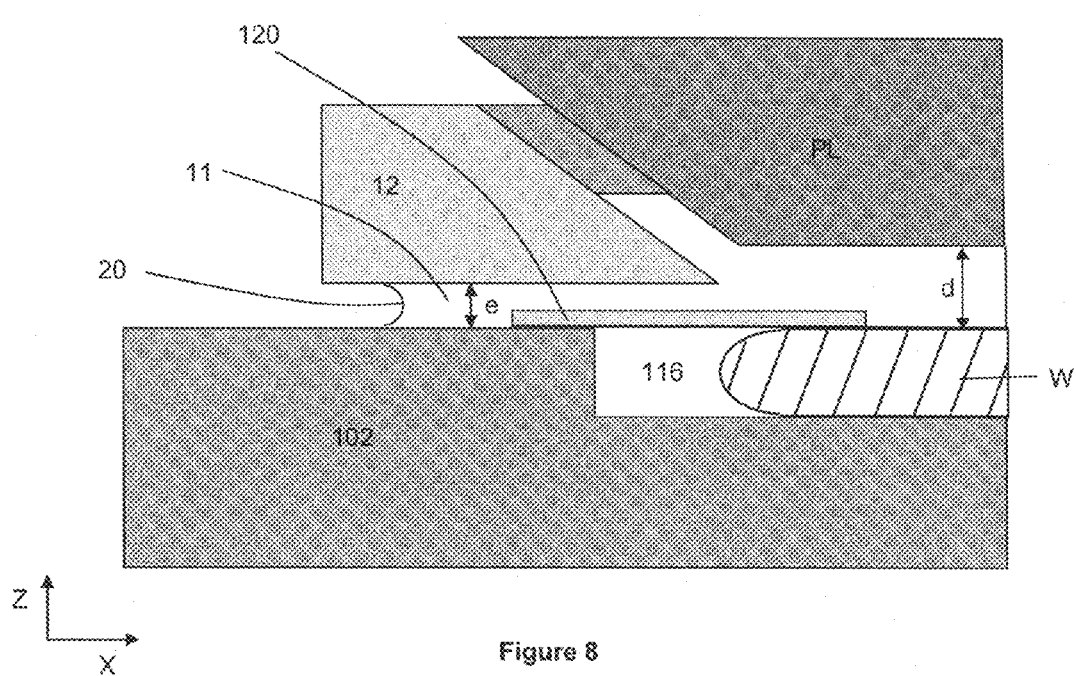
FIG. 8 depicts the closer view of the substrate table, including a ring according to an embodiment of the invention.

An embodiment of the invention is shown schematically in FIG. 8. Referring to FIG. 8, a ring 120 is provided which bridges the gap 116 between the substrate W and the substrate receiving portion 102 of the substrate table.

An advantage of the ring is that it may prevent (or inhibit) liquid from flowing into the gap 116, and thereby may reduce turbulence. This may reduce the formation of the bubbles in the liquid. When using the ring instead of a liquid extraction apparatus, the thermal load caused by the liquid extraction apparatus is avoided. This avoids distortion of the substrate due to the thermal load, and thus may improve overlay performance of the lithographic apparatus. Since the ring is a passive apparatus, it does not generate heat (unlike, for example, the liquid extraction apparatus), which may be undesirable in the lithographic apparatus.

The ring 120 may for example have a thickness of 30 microns or less, or 20 microns or less, and may be made from steel or some other suitable metal or other material. Steel may be used since it is strong, and will not be damaged for example by radiation generated by the lithographic apparatus or by the liquid 11 (which may for example be water).

The separation 'd' between the projection system PL and the substrate W is typically small. This is because the focal plane of the projection system is close to the final element of the projection system. For example the separation d may be 3 millimeters. The separation 'e' between the liquid confinement structure 12 and the substrate W is typically significantly smaller than this (in order to help provide effective confinement of the liquid). For example the separation e may be 0.1 millimeters (FIG. 8 is not drawn to scale). The ring 120 is sufficiently thin in the z-direction that it does not interfere with movement relative to the projection system PL or the liquid confinement structure 12. For example, as mentioned above, the ring may be 30 microns thick or less, 25 microns thick or less, and may be 20 microns thick or less.

The ring 120 may be held in place by one or more of a variety of means. For example, a vacuum may be established between the substrate receiving portion 102 of the substrate table and the substrate W. The vacuum may also exist in the gap 116, and may act to draw the ring 120 downwards, thereby pulling the ring onto the substrate W and onto the substrate receiving portion 102 of the substrate table. In this way the ring 120 is secured in place.

Positioning and removal of the ring 120 is described further below. However, it is noted here that the vacuum may be removed in order to allow the ring 120 (and the substrate W) to be removed from the substrate receiving portion 102 of the substrate table WT.

Electrostatic attraction may be used instead of or in combination with the vacuum to releasably secure the ring 120 in place. Gravity may be used as well as or instead of the vacuum or electrostatic attraction to hold the ring 120 in place. Other forces, or apparatus such as clamping apparatus, may be used to hold the ring 120 in place.

Figure 9A:
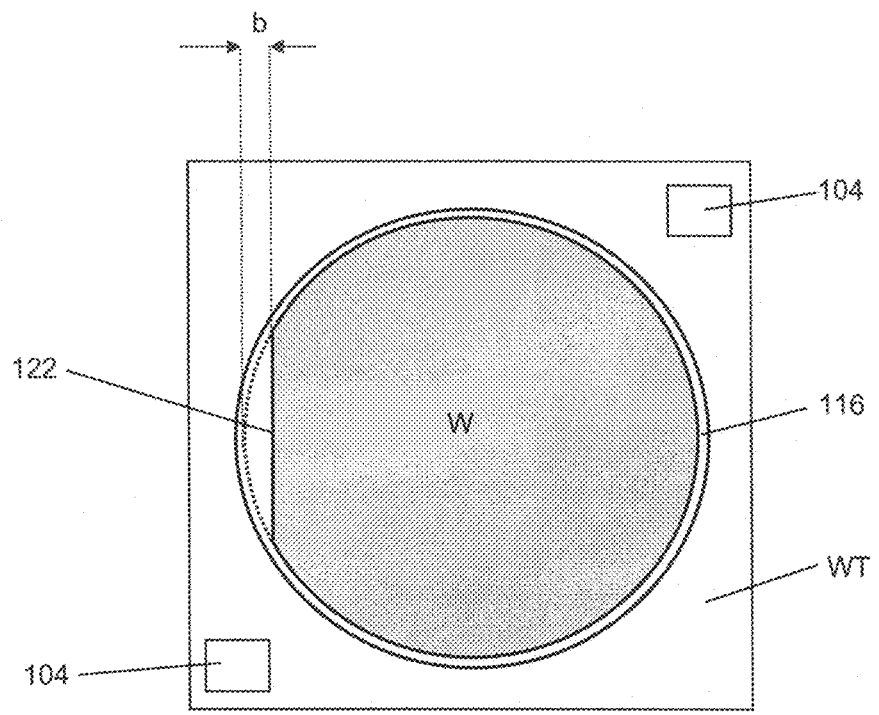
FIG. 9a depicts the substrate table viewed from above without the ring in place.

FIG. 9a shows a view from above the substrate W and the substrate table WT. For ease of illustration the substrate receiving portion and the outer portion of the substrate table WT are shown as a single entity. Optical detectors and associated electronics 104 can be seen in two corners of the substrate table WT. The gap 116 between the substrate W and the substrate table WT is shown. The gap 116 is exaggerated in FIG. 9a for illustrative purposes. Indeed, in general the figures used to illustrate the invention are not intended to be scale drawings, but rather are schematic illustrations.

The substrate W is of a type which is commonly used in lithography. The substrate is not fully circular, but instead a portion of the perimeter of the substrate is straight rather than curved. This straight portion 122 is sometimes referred to as the flat edge of a substrate. The separation between the straight portion 122 of the substrate and what would have been its outer edge if it had been fully circular is shown as distance 'b'. This distance may for example be 4.5 mm.

Figure 9B:
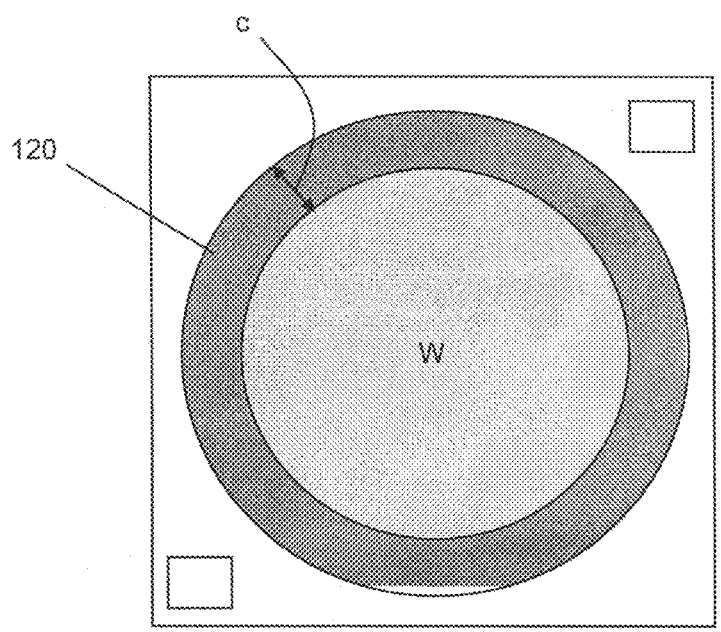
FIG. 9b depicts the substrate table viewed from above with the ring in place.

FIG. 9b shows the substrate W and substrate table WT of FIG. 9a, but in addition shows the ring 120. The width 'c' of the ring 120 is sufficient that it bridges the gap 116 between the substrate table WT and the substrate W. The gap is bridged at all locations, including at the flat edge 122 of the substrate. The width of the ring c, size of the gap, and the distance b, are all exaggerated in FIG. 9 for ease of illustration.

In an alternative type of substrate commonly used in lithography (not illustrated), the substrate is not provided with a flat edge but is instead provided with a notch. Where this is the case, the width of the ring is sufficient that it bridges the gap between the substrate table and the substrate, including at the notch.

The ring 120 is not so wide that for example it obscures the optical detectors 104 (it does not matter if the ring covers electronics associated with the detectors), or that it causes a collision to occur with a part of the lithographic apparatus when the substrate is being moved.

The width 'c' of the ring may for example be 4 millimeters. This may be for example to provide 3 millimeters which cover the outer periphery of the substrate, 0.6 millimeters which cover the gap 116 between the substrate table WT and the substrate W, and 0.4 millimeters which cover the inner periphery the substrate receiving portion 102. This is based on a SEMI standard M1.10 substrate 200 millimeters in diameter.

The width 'c' of the ring may be the same or similar for a substrate which is 300 millimeters in diameter.

The outer diameter of the ring may for example be 203 millimeters or greater for a 200 millimeter diameter substrate, or 303 millimeters or greater for a 300 millimeter diameter substrate. The outer diameter of the ring may be 210 millimeters or greater for a 200 millimeter diameter substrate, or 310 millimeters or greater for a 300 millimeter diameter substrate.

The outer diameter of the ring may be sufficient to close the gap 114 between the substrate receiving portion 102 and the outer portion 100 of the substrate table instead of the adhesive tape 118. For example, the outer diameter of the ring may be 215 millimeters or greater for a substrate table designed for 200 millimeter diameter substrates, or 315 millimeters or greater for a substrate table designed for 300 millimeter diameter substrates.

Other ring diameters may be used.

Although the substrate W is shown in FIG. 9 as being centrally positioned on the substrate table, such that the gap 116 is more or less constant around the perimeter of the substrate (with the exception of the region adjacent to the straight edge 122), this may not always be the case. For example, the substrate W may be off-centre, such that the gap 116 is reduced on one side of the substrate but is increased on the other side of the substrate. The distance by which the substrate is off-centre may for example be ±0.1 mm.

Furthermore, the diameter of the substrate W may vary by around ±0.1 mm for different substrates. The ring 120 is sufficiently wide to ensure that the gap 116 is bridged at all locations even if the substrate is off-centre with respect to the substrate table WT, or if it has a smaller than average diameter.

The ring 120 is sufficiently wide to ensure that the gap 116 is covered, taking into account inaccuracy of positioning of the ring. Positioning accuracy of the ring 120 on the substrate may for example be around 0.1 mm.

Figure 10:
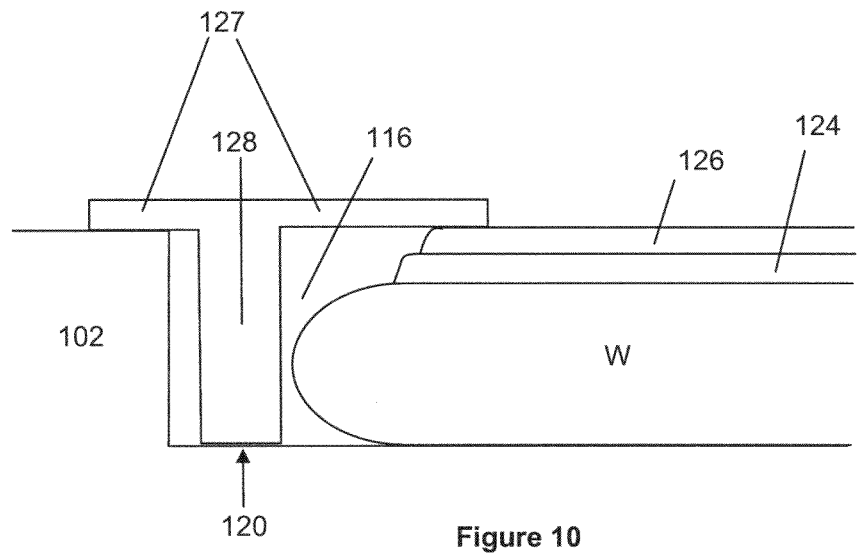
FIG. 10 depicts a cross-sectional view of part of the substrate and the substrate table, with the ring in place.

FIG. 10 shows, in cross-section, part of the substrate W together with part of the substrate receiving portion 102 of the substrate table. One or more patterned layers 124 have previously been provided on the substrate W. A layer of photoresist 126 has been provided on top of the previously provided layers 124. The previously provided layers 124 extend outwards further than the layer of photoresist 126.

It will be appreciated that in lithography a layer of photoresist will be provided on a substrate. The layer of photoresist has been omitted from preceding figures for ease of illustration. It is often the case that the layer of photoresist does not extend outwards as far as previously provided layers.

The ring 120 is sufficiently wide that it is in contact with the resist 126, rather than with the previously provided layers 124 or directly with the substrate W. This is advantageous because it prevents liquid (not shown) used during lithography from coming into contact with an edge of the previously provided layers 124, and with an edge of the resist 126. If the liquid were to come into contact with one or more of these edges, then there would be a danger that it would cause the resist or the previously provided layers to peel away from the substrate W. If this were to occur, then portions of the resist or the previously provided layers could break away, introducing unwanted contamination into the lithographic apparatus.

The ring 120 is provided with a protrusion 128. In this case, the ring 120 comprises a flange 128 which projects substantially perpendicularly from a sealing portion 127 of the ring. The flange 128 may be dimensioned such that it reaches to the bottom of the gap 116, and contacts the substrate receiving portion 102 of the substrate table. Where this occurs, the sealing portion may be raised up by for example a few 10s of microns with respect to the surface of the substrate. However, the flexibility of the sealing portion 127 is sufficient that in use the sealing portion may bend downwards and thereby form a seal against the substrate W. The sealing portion 127 may for example bend downwards in response to the downwards pressure exerted by the liquid confinement structure 12 and/or the liquid 11.

The term 'sealing portion' is not intended to mean that the ring always forms a liquid tight seal against the substrate and/or against the substrate receiving portion of the substrate table. In some instances it may do this. However, in other instances some liquid may be able to pass between the ring and the substrate and/or the substrate receiving portion of the substrate table.

Alternatively, the flange 128 may be dimensioned such that it only reaches partway into the gap 116.

The sealing portion 127 of the ring may be for example 20 μm thick, and the flange 128 may be for example 0.8 mm thick.

The flange 128 enhances the structural rigidity of the ring 120.

Figure 11B:
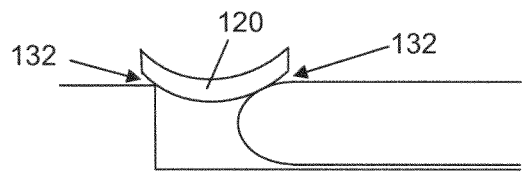
FIG. 11b depicts a cross-sectional view of part of the substrate and the substrate table, with a ring of the form shown in FIG. 8 in place.
Figure 11A:
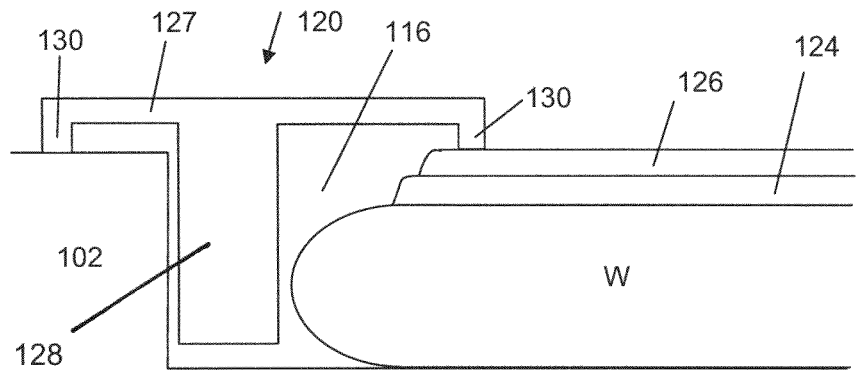
FIG. 11a depicts a cross-sectional view of part of the substrate and the substrate table, with a ring having an alternative form in place.

FIG. 1a shows, in cross-section, part of the substrate W and part of the substrate receiving portion 102 of the substrate table. The sealing portion 127 of the ring 120 is provided with a lip 130 at either edge. The lip is oriented downwards such that the lip comes into contact with the substrate W (e.g., photoresist 126 provided on the substrate) and into contact with the substrate receiving portion 102 of the substrate table. The remainder of the sealing portion 127 being suspended above these points of contact. The lip 130 provides the sealing portion 127 with additional rigidity. In addition, it mitigates against the possibility of downward bending of the center of the ring causing a gap to open between the sealing portion 127 and the substrate W or substrate receiving portion 102. FIG. 11b shows in exaggerated form how such a gap 132 may arise. It is desired to avoid such a gap because it may allow liquid to penetrate underneath the ring 120. In addition or alternatively, an upturned edge of the ring may collide with, for example, the liquid confinement structure 12 (see FIG. 7).

A benefit of the lips 130 provided on the ring is that the surface area upon which a vacuum in the gap 116 may act is increased, thereby increasing the force with which the ring 127 is drawn onto the substrate W and the substrate receiving portion 102.

The distance by which the lips 130 protrude towards the substrate W and/or substrate receiving portion 102 may be for example approximately 10 microns. The flange 128 may for example extend downwards by 2 mm, and may have a width of 1 mm.

Figure 12:
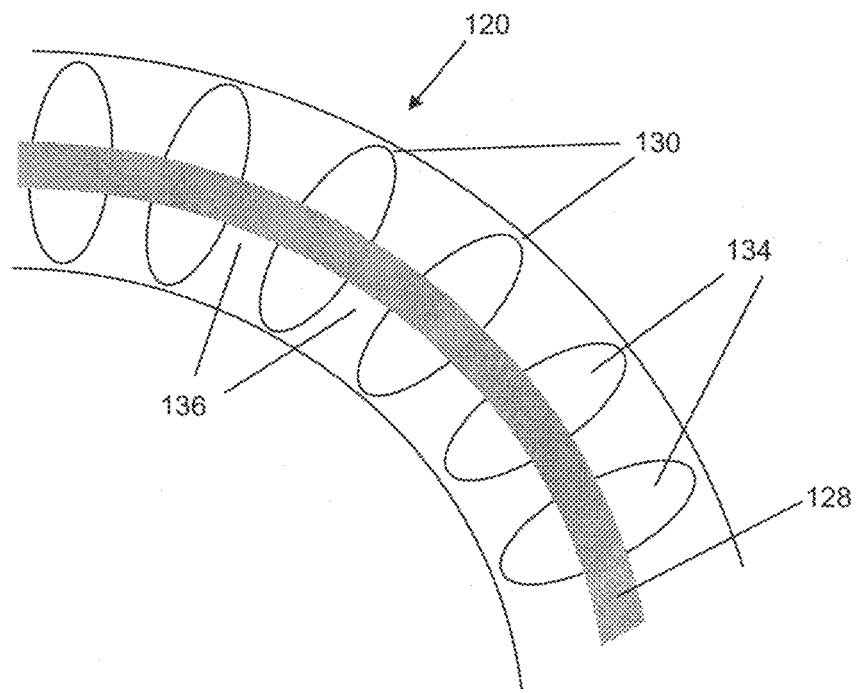
FIG. 12 depicts part of the ring as viewed from underneath.

It is not essential that the ring 120 has the same cross-sectional shape at all locations. For example, as shown in FIG. 12, the ring may be provided with a plurality of recesses 134 which extend, for example, along either side of the flange 128. Each recess 134 may for example measure between 10 and 100 microns across. Ribs 136 may extend between the recesses. A lip 130, which may for example be 1 micron wide, extends along the outer and inner periphery of the ring 120, and acts to confine the vacuum. The recesses provide additional surface area upon which a vacuum in the gap 116 may operate, thereby increasing the force with which the ring 120 is drawn onto the substrate W and substrate receiving portion 102. The recesses allow the vacuum to extend outwards towards an edge of the ring 120, thereby inhibiting bending of the ring (in a similar way to that illustrated in FIG. 11b). The recesses may for example be formed using acid etching in combination with lithographic patterning.

A polymer may be provided on a lowermost surface of the sealing portion 127 of the ring 120. The polymer is softer than steel (which may be used to form the ring). The polymer provides a softer surface than for example steel, and this may assist in providing a seal between the sealing portion 127 and the substrate W and between the sealing portion 127 and the substrate receiving portion 102 of the substrate table. It is desirable that the polymer is not adhesive, so that the polymer does not stick to the substrate W or the substrate receiving portion 102 of the substrate table.

A lowermost surface of the sealing portion 127 of the ring 120 may be hydrophobic. Where a hydrophobic surface is provided, this will increase the contact angle between the liquid and the surface. In an environment such as in the embodiment of the invention, this means that the pressure required to push liquid between the sealing portion 127 of the ring and the substrate table WT (or the substrate W) is increased.

A hydrophobic surface may be provided on the substrate receiving portion 102 of the substrate table (or at least on that part of the substrate receiving portion which is in contact with the sealing portion of the ring). This may help to increase the pressure required to push liquid between the sealing portion 127 of the ring and the substrate table WT.

Similarly, the resist (or a topcoat or other surface) on the substrate W may be hydrophobic. This may help to increase the pressure required to push liquid between the sealing portion 127 of the ring and the substrate W. A hydrophobic coating may be provided over the resist (or topcoat or other surface).

In general, the ring 120 is intended to close the gap 116. However due to tolerances in the manufacture of the ring, surface roughness of the substrate, or other tolerances, the ring may not form a liquid tight seal around the full perimeter of the substrate W (or the substrate receiving portion 102 of the substrate table). Where this is the case some liquid may enter the gap 116. However, an embodiment of the invention still provides an advantage that less liquid enters the gap 116 than would be the case if the ring 120 were not present. For example, the amount of liquid passing into the gap 116 may be such that it can be easily removed from the gap 116 without causing significant undesired thermal effects.

Where one or more hydrophobic surfaces are provided, this may reduce the amount of liquid which passes into the gap.

A benefit of providing one or more hydrophobic surfaces relates to the amount of force required to remove the ring following, e.g., lithographic exposure of the substrate. During lithographic exposure of the substrate, liquid droplets will accumulate between the ring and the substrate. These droplets will exert force which pulls the ring and the substrate (or substrate table). This pressure will be less if one or more hydrophobic surfaces are provided, thereby rendering it easier to remove the ring.

Although the use of a hydrophobic surface is particularly effective if the liquid is water, the hydrophobic surface may provide a same advantage for a liquid other than water.

A hydrophobic surface may be provided for example by applying a coating of hydrophobic polymer. An example of a hydrophobic polymer which could be used is Teflon.

If a polymer is provided on the lowermost surface of the sealing portion 127 of the ring 120, then the recesses 134 may for example be provided in the polymer and not in the ring itself. For example, if the ring 120 is made of steel, then the recesses may be provided in the polymer without being provided in the steel. Production methods which could be used to form the recesses in the polymer include jet printing of the polymer, coat and laser patroning, patronating in polymer and fixing (e.g. using glue) on the ring, lithography, tamponating, hot embossing and UV or chemical etching.

Alternatively the recesses may be provided in the polymer and in the ring itself (e.g. in the polymer and the steel).

The polymer in which the recesses are provided may be hydrophobic.

As previously mentioned the flange 128 provides the ring 120 with additional structural rigidity (stiffness). In addition the flange 128 may allow convenient handling of the ring 120 to be performed. Furthermore, the flange 128 may assist in positioning the ring 120 since it is dimensioned to be received into the gap 116.

Figure 13:
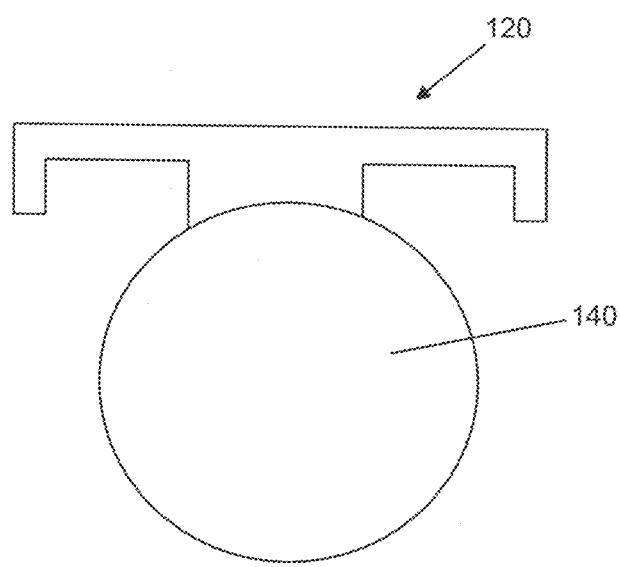
FIG. 13 depicts part of a ring having an alternative form viewed in cross-section.

The ring 120 may comprise one or a plurality of substantially curved protrusions 140 on an underside of the ring 120. An example of a ring provided with such a protrusion is shown in cross-section in FIG. 13. The protrusion 140 is shaped such that it will easily slide over the surface of a substrate or the substrate receiving portion of the substrate table. Thus, if the ring 120 is positioned such that it is not fully aligned with the gap 116, the curved protrusion 140 may slide across the surface of the substrate or the substrate receiving portion 102 and into the gap 116. In this way, minor misalignment of the ring 120 with respect to the substrate table WT may be corrected for automatically. An other shaped protrusion may be used to obtain the same correction of misalignment effect. In general the protrusion should be arranged to slide over the surface of the substrate and thereby provide cylindrical alignment of the ring 120 with the substrate. A protrusion which is rounded may achieve this (the protrusion does not necessarily have to be spherical as shown in FIG. 13). A spherical protrusion has an advantage that it is readily available (with accurate dimensions) and may be conveniently bonded to a ring.

The ring 120 may be removed from the gap 116 in order to allow the substrate W to be removed from the substrate table 102 and replaced with a new substrate (as is conventional during lithographic processing). This may be achieved for example by energizing an electromagnet located above the ring. The magnet may for example be attached to the projection system PL. Alternatively or additionally, a vacuum source may be used to raise the ring 120. The vacuum source may for example be attached to the projection system PL. A mechanical lifter may be arranged to mechanically engage with the ring and lift it. Instead of being provided on the projection system, the mechanical lifter arm, the electromagnetic apparatus and/or vacuum apparatus may be provided on a mechanical arm.

If a vacuum is being applied to the ring 120 to hold it in place on the substrate table, then the vacuum is switched off before removing the ring. Similarly, electrostatic clamping or mechanical clamping is disengaged before removing the ring.

In a further arrangement the ring may be provided on the substrate prior to the substrate being introduced into the lithographic apparatus, or may be placed on the substrate in a substrate handler part of the lithographic apparatus. The ring may be provided on the substrate before resist is applied to the substrate or after resist is applied to the substrate. The ring may for example be glued to the substrate before it enters the lithographic apparatus.

The position of the substrate during processing in a track apparatus may not be sufficiently well known to allow the ring to be conveniently fitted to the substrate within the track. Where this is the case a suitable detector may be added to the track to allow the position of the substrate to be more accurately determined.

Figure 14:
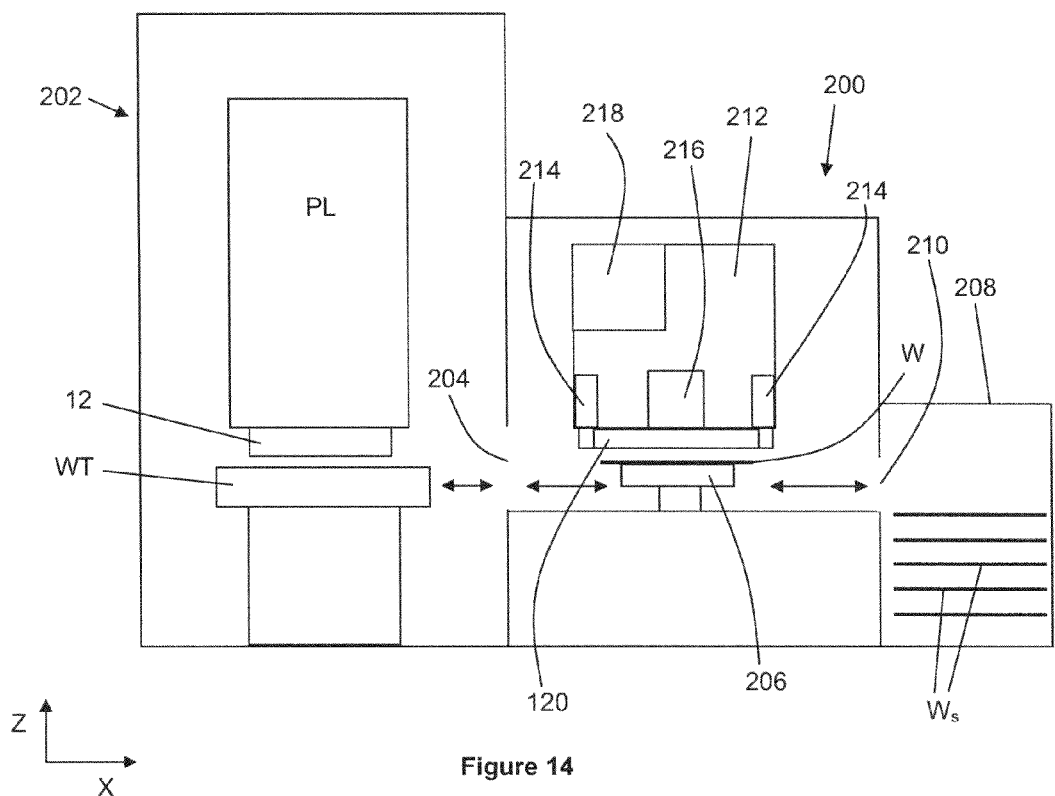
FIG. 14 depicts a lithographic apparatus according to an embodiment of the invention, including a substrate handler.

A substrate handler, for example in the lithographic apparatus, may be arranged to determine the position of the substrate with sufficient accuracy to allow the ring to be correctly positioned on the substrate (the substrate handler may be required to know the position for other purposes such as to ensure that the substrate will be correctly positioned on the substrate table). FIG. 14 shows a substrate handler which is capable of placing the ring onto a substrate. The substrate handler 200 may form part of the lithographic apparatus, and is connected to an exposure chamber 202 of the lithographic apparatus via an opening 204. A substrate W rests on a moveable arm 206 which is able to move in the x-direction. A substrate storage apparatus 208 holds a plurality of substrates Ws for delivery to the lithographic apparatus via an opening 210.

A ring handler 212 comprises a housing provided with one or more electromagnets 214 on a lowermost surface. The electromagnet(s) 214 is positioned such that it may secure the ring 120 to the ring handler 212.

An optical detector 216, which may be for example an image detector, is provided on a lowermost surface of the ring handler. A controller 218 is provided in the ring handler (the controller may be provided at some other location). The controller 218 receives signals from the optical detector 216 and controls the electromagnet(s) and the position of the moveable arm 206.

In use, a substrate W is taken from the storage apparatus 208 via the opening 210 by the moveable arm 206. The moveable arm moves beneath the optical detector 216 of the ring handler in such a manner that the optical detector is able to view an edge and/or alignment mark of the substrate (either or both may be required). The position of the moveable arm is also monitored. In this way, the position of the substrate is determined with sufficient accuracy to allow the substrate to be located beneath the ring 120. Once the substrate has been positioned beneath the ring 120 the electromagnet(s) 214 is switched off. This allows the ring 120 to drop onto the substrate. The substrate is then moved by the moveable arm to the opening 204 which connects the substrate handler 200 with the exposure chamber 202. The moveable arm 206 passes the substrate onto the substrate table WT, following which exposure of a pattern onto the substrate may take place.

Once exposure has been completed, the substrate is removed from the exposure chamber 202 by the moveable arm 206. The moveable arm then moves such that the ring 120 is positioned below the electromagnet(s) 214. The electromagnet(s) 214 is energized, thereby removing the ring 120 from the substrate. The substrate is returned to the substrate storage apparatus 208. A new substrate is then taken from the substrate storage apparatus 208, and the process is repeated.

Two or more moveable arms may be used, to allow one of the arms to take a substrate from the substrate storage apparatus 208 while, for example, the second arm is retrieving a substrate from the exposure chamber 202. Where this is done, appropriate changes may be made to the process described above. More than one ring may be used with one ring handler or a plurality of ring handlers. Two or more ring handlers may be provided, so that for example adding a ring to one substrate may be done at the same time that a ring is being removed from a different substrate. Where this is done, a moveable arm may pass the ring between ring handlers, to ensure that a ring is suitably located to be placed on a subsequent substrate.

The ring handler 212 may be provided with a temperature controlling apparatus (not shown) arranged to control the temperature of the ring 120.

Although the ring has been illustrated as being annular, it is not essential that the ring is annular. For example, the ring may have a flat inner edge, which is arranged to coincide with the straight portion of the substrate (an example of the straight portion of the substrate is shown in FIG. 9a).

Conventional lithographic substrates have a diameter of 200 mm or 300 mm. The ring has an inner diameter which is less than the diameter of a conventional lithographic substrate and an outer diameter which is greater than the diameter of a conventional lithographic substrate. If the lithographic substrate has a diameter of 200 mm, then the inner diameter of the ring is less than 200 mm and the outer diameter of the ring is greater than 200 mm. If the lithographic substrate has a diameter of 300 mm, then the inner diameter of the ring is less than 300 mm and the outer diameter of the ring is greater than 300 mm. If the ring is provided with a protrusion, then the inner diameter of the protrusion is greater than the diameter of a conventional lithographic substrate (i.e. greater than 200 mm or greater than 300 mm).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, where applicable, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described.

The invention claimed is:

1. A lithographic apparatus, comprising:
a substrate table configured to hold a substrate;
a projection system configured to project a patterned beam of radiation onto the substrate;
a liquid supply system configured to provide a liquid to a space between the projection system and the substrate table; and
a ring configured and sized to substantially cover a gap between a peripheral edge of the substrate and a surface of the substrate table that faces said peripheral edge of the substrate, the ring comprising a seal portion and, on a lowermost surface, a protrusion dimensioned to fit into the gap, the seal portion being wider than the protrusion so as to be in contact with an upper surface of the substrate and an upper surface of the substrate table when said seal portion covers the gap and said protrusion is located in the gap, the ring including the protrusion being removable from the gap,
wherein the seal portion of the ring comprises a lip configured to contact the upper surface of the substrate or the substrate table when the seal portion covers the gap, and wherein said protrusion is dimensioned to fit into the gap without filling a volume of the gap extending beyond the peripheral edge.

2. The lithographic apparatus of claim 1, wherein the protrusion comprises a flange configured to extend into the gap.

3. The lithographic apparatus of claim 1, wherein the ring comprises a plurality of recesses which extend partway to an outer edge of the ring, or an inner edge of the ring, or both the inner and outer edges.

4. The lithographic apparatus of claim 1, wherein, when the ring covers the gap, the ring forms a seal against the substrate.

5. The lithographic apparatus of claim 1, wherein, when the ring covers the gap, the ring forms a seal against the substrate table.

6. The lithographic apparatus of claim 1, wherein the ring is dimensioned such that, when the ring covers the gap, the distance by which the ring projects above the substrate is less than the separation between the substrate and a liquid confinement structure of the lithographic apparatus.

7. The lithographic apparatus of claim 1, wherein the ring is sufficiently wide that it covers the gap at all positions around the periphery of the substrate, but is not so wide that it obscures an optical detector provided in the substrate table.

8. The lithographic apparatus of claim 1, wherein a polymer is provided on the seal portion of the ring.

9. The lithographic apparatus of claim 1, wherein a hydrophobic surface is provided on the seal portion of the ring.

10. The lithographic apparatus of claim 1, wherein the substrate table is configured to provide a vacuum to hold the ring in place.

11. The lithographic apparatus of claim 1, wherein the seal portion of the ring is 30 microns thick or less.

12. The lithographic apparatus of claim 1, further comprising a substrate handler configured to move a substrate from or to the substrate table, the substrate handler comprising a ring handler configured to (i) place the ring on the substrate, (ii) remove the ring from the substrate, or (iii) both (i) and (ii).

13. The lithographic apparatus of claim 12, wherein the ring handler comprises an optical detector arranged to measure a position of the substrate, and a controller arranged to move the substrate to a location where the ring may be placed onto the substrate.

14. The lithographic apparatus of claim 1, wherein the lip is on an inner edge of the ring and the seal portion comprises a further lip, on its outer edge, and wherein, when the ring covers the gap, the lip is in contact with the upper surface of the substrate and the further lip is in contact with the upper surface of the substrate table.

15. The lithographic apparatus of claim 14, wherein the lip and the further lip protrude downwardly from a surface of the seal portion facing toward the substrate and the substrate table.

16. The lithographic apparatus of claim 15, wherein the lip and the further lip protrude substantially perpendicularly from the surface of the seal portion facing toward the substrate and the substrate table.

17. The lithographic apparatus of claim 14, wherein a surface of the seal portion facing toward the substrate and the substrate table and extending between the lip and the further lip is suspended above a point of contact between the lip and the upper surface of the substrate and a point of contact between the further lip and the upper surface of the substrate table.

18. The lithographic apparatus of claim 1, wherein the lip is a protrusion from an undersurface of the seal portion towards the upper surface of the substrate or the upper surface of the substrate table.

19. The lithographic apparatus of claim 1, wherein the seal portion is substantially flexible such that, in use, the seal portion is capable of bending in response to a pressure exerted on said seal portion.

20. The lithographic apparatus of claim 19, wherein the seal portion is capable of bending downwardly toward the gap in response to a pressure exerted on said seal portion.

21. The lithographic apparatus of claim 20, wherein the pressure is exerted by the liquid supply system, or the liquid or both.

22. The lithographic apparatus of claim 1, wherein the seal portion and the protrusion are made of a same material.

23. The lithographic apparatus of claim 22, wherein the material is steel.

24. A lithographic apparatus comprising:
a substrate table configured to hold a substrate;
a projection system configured to project a patterned beam of radiation onto the substrate;
a liquid supply system configured to provide a liquid to a space between the projection system and the substrate table; and
a ring configured and sized to substantially cover a gap between the substrate and the substrate table, the ring comprising a seal portion and, on a lowermost surface, a protrusion dimensioned to fit into the gap, the seal portion being wider than the protrusion so as to be in contact with an upper surface of the substrate and an upper surface of the substrate table when said seal portion covers the gap and said protrusion is located in the gap, the ring including the protrusion being removable from the gap,
wherein the protrusion comprises a rounded protrusion that is attached to the seal portion so that the protrusion is adapted to be removably inserted into the gap.

25. The lithographic apparatus of claim 24, wherein the rounded protrusion is substantially spherical.

26. A lithographic apparatus, comprising:
a substrate table configured to hold a substrate;
a projection system configured to project a patterned beam of radiation onto the substrate;
a liquid supply system configured to provide a liquid to a space between the projection system and the substrate table; and
a ring configured and sized to substantially cover a gap between the substrate and the substrate table, the ring comprising a seal portion that is wider than the gap so as to be in contact with an upper surface of the substrate and with an upper surface of the substrate table when the ring covers the gap, and the ring comprising a plurality of permanent recesses arranged in a lowermost surface of the seal portion facing toward the substrate and the substrate table, wherein the plurality of recesses extend partway to an outer edge of the ring, or an inner edge of the ring, or both the inner and outer edges, and wherein each recess is defined by an outer surface and an edge on the lowermost surface, and wherein the outer surface of each recess is defined by the edge of the recess on the lowermost surface.

27. The lithographic apparatus of claim 26, wherein the seal portion of the ring comprises a first lip on its inner edge, and a second lip on its outer edge, and wherein, when the ring covers the gap, the first lip is in contact with the upper surface of the substrate and the second lip is in contact with the upper surface of the substrate table.

28. The lithographic apparatus of claim 26, wherein a hydrophobic surface is provided on the seal portion of the ring.

29. The lithographic apparatus of claim 26, wherein the seal portion of the ring is 30 microns thick or less.

30. A lithographic apparatus, comprising:
a substrate table configured to hold a substrate;
a projection system configured to project a patterned beam of radiation onto the substrate;
a liquid supply system configured to provide a liquid to a space between the projection system and the substrate table; and
a ring configured and sized to substantially cover a gap between the substrate and the substrate table, the ring comprising a seal portion, the seal portion being wider than the gap so as to be in contact with an upper surface of the substrate and an upper surface of the substrate table when said seal portion covers the gap, wherein a lowermost surface of the seal portion contacting the upper surface of the substrate table and/or the upper surface of the substrate outside the gap is coated with a hydrophobic material to form a hydrophobic surface.

31. The lithographic apparatus of claim 30, wherein the seal portion of the ring comprises a first lip on its inner edge, and a second lip on its outer edge, and wherein, when the ring covers the gap, the first lip is in contact with the upper surface of the substrate and the second lip is in contact with the upper surface of the substrate table.

32. The lithographic apparatus of claim 30, wherein the seal portion of the ring is 30 microns thick or less.

33. The lithographic apparatus of claim 30, wherein at least part of an uppermost surface of the seal portion is a non-hydrophobic surface.

34. The lithographic apparatus of claim 30, wherein at least part of an uppermost surface of the seal portion is made without a hydrophobic material.

* * * * *